United States Patent [19]

Shelby

[11] 3,991,371
[45] Nov. 9, 1976

[54] AUTOMATIC FREQUENCY CONTROL OF VOLTAGE VARIABLE CAPACITOR TUNED RECEIVERS

[75] Inventor: Rufus F. Shelby, Philadelphia, Pa.

[73] Assignee: Aeronutronic Ford Corporation, Blue Bell, Pa.

[22] Filed: Apr. 20, 1971

[21] Appl. No.: 135,596

[52] U.S. Cl............................ 325/422; 178/5.8 AF; 325/423
[51] Int. Cl.²........................................... H04B 1/26
[58] Field of Search .......... 325/418, 419, 420, 422, 325/423, 185, 186, 492, 421; 178/5.8 A, 5.8 F; 331/183, 185, 186

[56] References Cited
UNITED STATES PATENTS

| | | | |
|---|---|---|---|
| 2,896,018 | 7/1959 | Rhodes et al. | 178/5.8 F |
| 3,189,830 | 6/1965 | Jenkins et al. | 325/492 |
| 3,480,866 | 11/1969 | Hadjandreas | 325/423 |
| 3,619,803 | 11/1971 | Klein | 325/422 X |
| 3,628,152 | 12/1971 | Carlson | 325/364 |
| 3,693,094 | 9/1972 | Kanamaru et al. | 178/5.8 AF |
| 3,705,356 | 12/1972 | Russell | 325/465 |

*Primary Examiner*—Robert L. Richardson
*Assistant Examiner*—Marc E. Bookbinder
*Attorney, Agent, or Firm*—Robert D. Sanborn

[57] ABSTRACT

When voltage variable capacitor (VVC) diodes are used to tune the r-f circuits of receivers, a potentiometer is usually used as the mechanically operated source of variable voltage. To avoid tuning problems associated with power line variations, or receiver circuit conditions that cause voltage variations, a well regulated source of d-c voltage is used to supply the control circuits. The improvement disclosed here involves applying an automatic frequency control (AFC) voltage, also known as automatic fine tuning (AFT) voltage, to the control circuit of the voltage regulator. Since the tuning voltages are obtained from the regulated source, the magnitude of regulated voltage will be controlled by the AFC voltage. If the polarity of AFC action is set to minimize the AFC error voltage, automatic frequency control or fine tuning is achieved.

6 Claims, 2 Drawing Figures

INVENTOR.
RUFUS F. SHELBY
BY Gail W. Woodward

AUTOMATIC FREQUENCY CONTROL OF VOLTAGE VARIABLE CAPACITOR TUNED RECEIVERS

BACKGROUND OF THE INVENTION

Voltage variable capacitor (VVC) tuning of radio frequency circuits has been made commercially attractive by the introduction of semiconductor diodes which have been developed to the point where their use is economical and practical.

A p-n junction diode when back biased presents a capacitance that varies with bias. Such capacitors can be made to have large nominal capacitance values, have very low control current requirements, can be varied over a substantial range, and have very good electrical performance. The nature of the semiconductor diode results in very small size and freedom from mechanical effects.

Basically the diode is r-f connected across an inductor or tuned circuit. D-c coupling means is provided for applying a control voltage which can be generated remotely by a potentiometer or other electronic circuit. As reverse bias is increased the diode depletion region widens and its capacitance decreases thereby raising the circuit resonant frequency. Thus frequency is proportional to reverse bias voltage.

Since the diode is small it can be located physically at the optimum point with only an electrical connection for tuning. This greatly facilitates both electrical and mechanical circuit design.

In one use of VVC tuning, a bank of touch buttons is associated with an array of electronic latches and potentiometers. When a touch button is actuated, the associated potentiometer is connected to a source of regulated d-c voltage. The circuit array is interconnected so that when any one potentiometer is actuated all others are deactuated. Indicating lamps may be incorporated to show which of the plurality of potentiometers is in operation. The variable d-c voltage from the potentiometers is used to control the tuning of the r-f circuits in a receiver so that the touch-buttom selected potentiometer can be used as either a knob-operated remote-tuning control or a preselected frequency-control device.

SUMMARY OF THE INVENTION

It is an object of this invention to incorporate the AFC function into a VVC tuned superheterodyne receiver.

It is a further object to incorporate the AFC function by applying the output of a discriminator to the control section of the electronic voltage regulator that energizes the VVC control circuit.

These and other objects are accomplished by incorporating an additional control function into a conventional voltage regulator. For example, in a television receiver, an i-f discriminator is designed to sense the frequency of the video signal carrier. The discriminator is connected to provide a particular d-c output voltage under the condition of correct tuning. Any departure from this condition will either raise or lower the d-c the d-c output voltage depending upon the direction of departure. When the discriminator is connected to the control section of the voltage regulator, the receiver local oscillator will automatically be tuned to return the discriminator output to its reference level.

In a typical case, the discriminator is poled so that when the receiver local oscillator is too high in frequency, its output increases in a negative direction. When this negative voltage is applied to the regulator, the output voltage is lowered thereby lowering the local oscillator frequency. Thus AFC based upon the video carrier is achieved by way of the voltage regulator.

DESCRIPTION OF THE INVENTION

Figure 1:
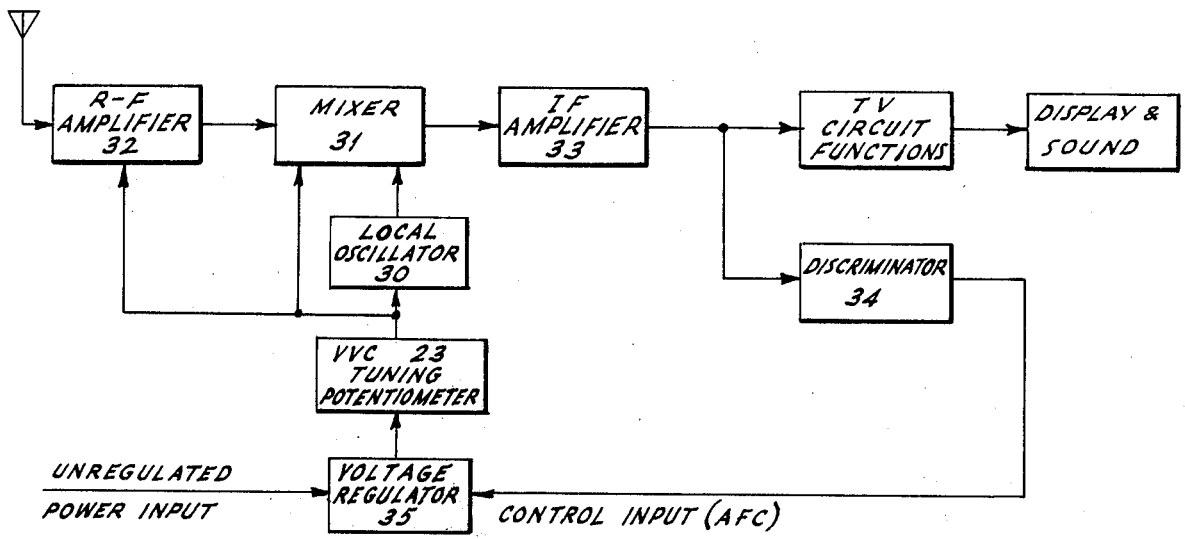
FIG. 1 is a block diagram of a television receiver system showing the AFC elements.

In FIG. 1 the simplified block diagram of the television superheterodyne receiver shows a tuner employing VVC tuning. Usually three diodes having the desired capacitance versus voltage change are used to tune the local oscillator 30, r-f amplifier 32, and mixer 31. The trio of diodes may be chosen to have compatible characteristics so that all three track in terms of frequency versus a common tuning voltage. Thus the receiver is tuned by means of a single variable voltage. This tuning voltage is obtained from a potentiometer 23 that is connected across a source of regulated voltage. While there are three tuned circuits only the local oscillator is effective to change the frequency of the i-f signal. Therefore in the following discussion the tuning control will be discussed in relation to the local oscillator 30. I-f amplifier 33 is a broadband device that amplifies both sound and video carrier signals. The i-f amplifier is followed by conventional television circuits that separate the sound and video signals and process them to provide a picture display and sound outputs. These latter circuit functions are unrelated to the invention and will not be discussed in detail.

The discriminator 34 coupled to the i-f amplifier can be tuned to either the video or sound carrier but video carrier tuning is preferred. Conventional receiver design calls for a video i-f carrier of 45.75 MHz and the local oscillator is tuned 45.75 MHz above the desired signal frequency. Therefore if the local oscillator frequency is too high the i.f. also will be too high. Hence the discriminator is connected so as to produce a negative or lower than nominal output. This negative voltage coupled to the regulator lowers its output, thereby lowering the local oscillator frequency to correct the i.f.

Figure 2:
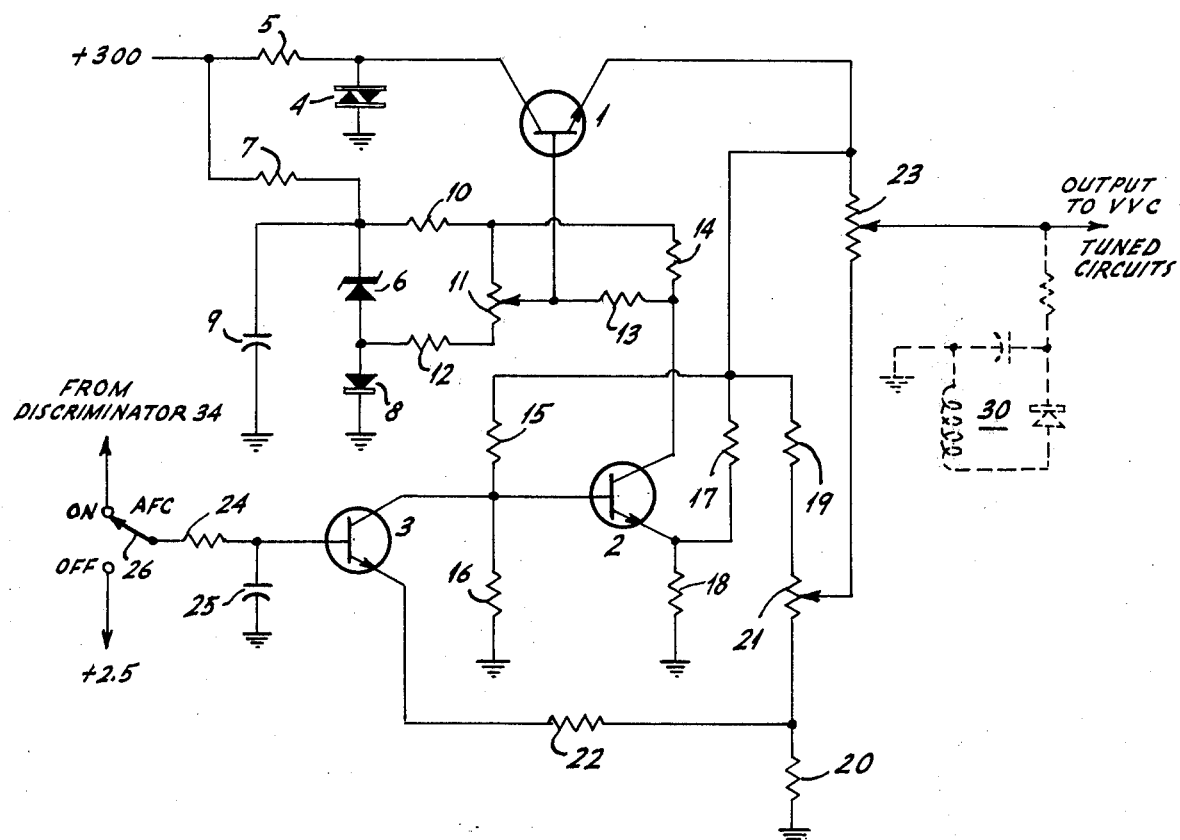
FIG. 2 is a schematic diagram showing the preferred circuit for practicing the invention.

FIG. 2 shows the preferred circuit for the voltage regulator 35. The collector of the series regulator transistor 1 is supplied at a potential of about 40 volts from the + 300-volt input by the action of varistor 4 and series dropping resistor 5. Zener diode 6 and series dropping resistor 7 establish at their common junction a 33-volt reference from the 300-volt line. Forward biased silicon diode 8 temperature compensates the regulator and capacitor 9 bypasses the noise signals commonly produced by zener diode action. Conduction in the series regulator transistor 1, and hence the regulated voltage at the emitter, is adjusted by means of potentiometer 11 in conjunction with voltage divider resistors 10 and 12. Resistors 13 and 14 connect the collector of control transistor 2 to the series regulator base.

Tow voltage dividers couple the regulated voltage to the emitter and base of control transistor 2. However, the base is more tightly coupled than the emitter. The divider action of resistors 17 and 18 is greater than the divider action of resistors 15 and 16. Thus if the emitter voltage of transistor 1 tends to rise, the base of transistor 2 rises faster than its emitter so that the collector will be driven in a negative direction, thereby lowering the base and consequently emitter voltage of transistor 1. This is the basis voltage regulator action. The output voltage level that potentiometer 11 establishes will be closely held by the circuit action. Nominal output is about 27 volts when using component values identified hereinafter.

The regulated voltage is applied to one end of potentiometer 23 which is the element that is designed to produce the tuning voltage for the VVC circuit, such as is shown as circuit 30 in dotted outline. The other end of potentiometer 23 is supplied with a lower potential produced by a voltage divider comprising resistors 19 and 20 along with potentiometer 21. Potentiometers 21 and 11 are service adjustments that permit trimming the voltage range of the VVC tuning control potentiometer 23. In the case where potentiometer 23 is mechanically coupled to an indicating dial, tracking can be achieved by adjusting potentiometer 11 so that the high frequency channels track and potentiometer 21 is adjusted so that the low frequency channels track.

Transistor 3 is the AFC amplifying device for control of the voltage regulator and is connected to provide two injection points. The collector of transistor 3 is connected to the base of the regulator control transistor 2 and the emitter is connected through resistor 22 to the voltage divider 19, 21, 20 that provides the low frequency tuning dial tracking. When the AFC switch 26 is turned to the off position a reference level of 2.5 volts is applied to the base of transistor 3 through a transient filter composed of resistor 24 and capacitor 25. This voltage corresponds to the discriminator output when it is being fed a signal of the desired frequency. In this condition normal tuning is available without AFC. When switch 26 is turned to the on position, the discriminator output is fed to the base of transistor 3 through the transient filter composed of resistor 24 and capacitor 25. When the discriminator produces a positive output, or one greater than 2.5 volts, indicative of too low a local oscillator frequency, transistor 3 conducts more heavily thereby lowering its collector voltage. This reduces conduction in transistor 2 thereby raising its collector voltage. This action raises the base voltage on transistor 1 which in turn raises the tuning voltage and hence the local oscillator frequency.

The same positive increase of voltage into transistor 3 raises its emitter voltage and hence the voltage at the bottom end of potentiometer 23. It can be seen that AFC control voltage action is applied in the same direction to both ends of the tuning potentiometer. This provides for constant AFC action regardless of where the tuning control is set. If the control voltage were applied to only the upper end of the potentiometer 23, the AFC effect would be much greater for the high channels than for the low channels.

The following list sets forth a set of component values that has provided good performance of the preferred circuit.

Transistor 1 — 2N1863
Transistor 2 — 2N3904
Transistor 3 — 2N3904
Diode 8 — Silicon Planar FD-100
Diode 6 — 33 volt zener ZTK-33
Diode 4 — 40 volt varistor
Capacitor 9 — 0.1 Mfd
Capacitor 25 — 0.01 Mfd
Resistor 5 — 15k ohms 7 watt
Resistor 7 — 36k ohms 3 watt
Resistor 10 — 470 ohms
Resistor 12 — 22k ohms 5%
Resistor 13 — 100k ohms
Resistor 14 — 7.2k ohms
Resistor 15 — 6.2k ohms 5%
Resistor 16 — 5.1k ohms 5%
Resistor 17 — 27k ohms 5%
Resistor 18 — 6.8k ohms 5%
Resistor 19 — 5.6k ohms 5%
Resistor 20 — 82 ohms
Resistor 22 — 2.7k ohms
Resistor 24 — 1k ohms
Potentiometer 11 — 10k ohms
Potentiometer 21 — 2k ohms
Potentiometer 23 — 50k Linear
Switch 26 — SPDT Note: Unless otherwise specified all resistors are ¼ watt and 20% resistance tolerance.

While the above describes a signle VVC tuning potentiometer it is clear that more than one could be employed with the use of a pushbutton selector or a touch-button bank with electronic latch selector to connect the desired one of a plurality.

I claim:

1. In combination with a signal receiver of a type including AFT network means providing an AFT signal at an AFT signal input terminal, a tuner of a type employing the voltage variable capacitance characteristic of a voltage variable capacitance diode for varying the tuning of said receiver and a plurality of channel selecting networks for selecting different channels to which said receiver may be tuned and applying different voltages to said diode to change the tuning of said receiver; a source of D.C. potential for said channel selecting networks connected to vary said different voltages in response to changes in said D.C. potential, a voltage regulator connected in circuit with said source of D.C. potential for regulating said D.C. potential, said voltage regulator having an input terminal to which said AFT signal is supplied and being of a type that maintains said D.C. potential constant when said AFT signal is constant and varies the D.C. potential regulated thereby in response to any change in said AFT signal, and means connecting said AFT signal input terminal and said voltage regulator for supplying said AFT signal to said voltage regulator to vary the magnitude of said D.C. potential regulated by said voltage regulator in response to changes in said AFT signal.

2. The invention according to claim 1 including an AFT converter network having a high impedance input and a low impedance output and connected between said AFT signal input terminal and said voltage regulator for changing said AFT Signal from a high impedance source signal to a lower impedance source signal.

3. In a superheterodyne receiver having a mixer, local oscillator, and intermediate frequency amplifier, a voltage variable capacitor for tuning said local oscillator, a frequency discriminator connected to said intermediate frequency amplifier and tuned to the intermediate carrier frequency of a signal to be amplified in said intermediate frequency amplifier, said discriminator generating an output voltage for automatic frequency control purposes, an electronically regulated voltage supply including control means for varying the output voltage of said voltage supply in response to a control potential, a tuning potentiometer, means connecting a first end of said tuning potentiometer to said voltage supply, means applying a selected portion of the voltage across said potentiometer to said voltage variable capacitor, additional amplifying means applying the output voltage from said discriminator to said control means, and means connecting a portion of the output of said additional amplifying means to a second end of said tuning potentiometer whereby said discriminator output voltage changes the potentials applied to both ends of said tuning potentiometer in the same direction, said discriminator being connected to provide said control potential to effect automatic frequency control of said local oscillator.

4. In a superheterodyne receiver having a local oscillator tuned by means of a voltage variable capacitor, an intermediate frequency amplifier, a tuning potentiometer for supplying a variable voltage for tuning said local oscillator, and a voltage supply including a voltage regulator for energizing said potentiometer, said voltage regulator including control means connected to provide variations in the output of said voltage regulator in response to a control potential; the improvement comprising means connecting a first terminal of said potentiometer to the output of said voltage regulator in said voltage supply; a frequency discriminator connected to said intermediate frequency amplifier and tuned to the desired intermediate frequency; amplifying means for connecting the output of said discriminator to said control means to provide a control potential to adjust the magnitude of the regulated voltage in accordance with the discriminator output voltage and in a direction sense that will result in automatic frequency control of said local oscillator; and means connecting the output of said amplifying means to the other end of said potentiometer so that said discriminator output voltage changes the potentials applied to both ends of said potentiometer in the same direction.

5. In combination with a signal receiver of a type including AFT network means providing an AFT signal at an AFT signal input terminal, a tuner of a type employing the voltage variable capacitance characteristic of a voltage variable capacitance diode for varying the tuning of said receiver and a channel selecting network for selecting different channels to which said receiver may be tuned and applying different voltages to said diode to change the tuning of said receiver, a source of D.C. potential for said channel selecting network connected to vary said different voltages in response to changes in said D.C. potential, a voltage regulator connected in circuit with said source of D.C. potential for regulating said D.C. potential, said voltage regulator having an input terminal to which said AFT signal is supplied and being of a type that maintains said D.C. potential constant when said AFT signal is constant and varies the D.C. potential regulated thereby in response to any change in said AFT signal, and means connecting said AFT signal input terminal and said voltage regulator for supplying said AFT signal to said voltage regulator to vary the magnitude of said D.C. potential regulated by said voltage regulator in response to changes in said AFT signal.

6. The invention according to claim 5 including an AFT converter network having a high impedance input and a low impedance output and connected between said AFT signal input terminal and said voltage regulator for changing said AFT signal from a high impedance source signal to a lower impedance source signal.

* * * * *